(12) United States Patent
Kaneshiro et al.

(10) Patent No.: US 8,513,373 B2
(45) Date of Patent: Aug. 20, 2013

(54) PROCESS FOR PRODUCTION OF POLYIMIDE FILM HAVING HIGH ADHESIVENESS

(75) Inventors: Hisayasu Kaneshiro, Uji (JP); Takashi Kikuchi, Otsu (JP)

(73) Assignee: Kaneka Corporation, Osaka (JP)

( * ) Notice: Subject to any disclaimer, the term of this patent is extended or adjusted under 35 U.S.C. 154(b) by 331 days.

(21) Appl. No.: 11/663,674

(22) PCT Filed: Sep. 20, 2005

(86) PCT No.: PCT/JP2005/017283
§ 371 (c)(1),
(2), (4) Date: Mar. 22, 2007

(87) PCT Pub. No.: WO2006/033324
PCT Pub. Date: Mar. 30, 2006

(65) Prior Publication Data
US 2008/0287642 A1 Nov. 20, 2008

(30) Foreign Application Priority Data
Sep. 24, 2004 (JP) .................................. 2004-276766

(51) Int. Cl.
*C08G 73/00* (2006.01)

(52) U.S. Cl.
USPC ............. 528/170; 428/349; 428/458; 528/12; 528/21; 528/26; 528/38; 528/310; 528/351; 528/353

(58) Field of Classification Search
USPC ................. 528/310, 12, 21, 26, 38, 351, 353, 528/170; 428/349, 458
See application file for complete search history.

(56) References Cited

U.S. PATENT DOCUMENTS

| | | | | |
|---|---|---|---|---|
| 5,081,229 | A * | 1/1992 | Akahori et al. ............... | 528/353 |
| 5,502,143 | A * | 3/1996 | Oie et al. ........................ | 528/12 |
| 6,129,982 | A | 10/2000 | Yamaguchi et al. | |
| 2003/0153476 | A1* | 8/2003 | Akita et al. .................... | 510/175 |
| 2005/1238896 | | 10/2005 | Itoh et al. | |

FOREIGN PATENT DOCUMENTS

| | | |
|---|---|---|
| EP | 1469037 | * 10/2004 |
| JP | 04-161428 | 6/1992 |
| JP | 04-161437 | 6/1992 |
| JP | 04-320422 | 11/1992 |
| JP | 04-325562 | 11/1992 |
| JP | 04-335028 | 11/1992 |
| JP | 05-070590 | 3/1993 |
| JP | 05-222219 | 8/1993 |
| JP | 06-032926 | 2/1994 |
| JP | 11-158276 | 6/1999 |
| JP | 02955724 | 7/1999 |
| JP | 2000-080178 | 3/2000 |
| JP | 2000-119521 | 4/2000 |
| WO | WO 03/060010 | * 7/2003 |
| WO | 03097725 | 11/2003 |

OTHER PUBLICATIONS

Patent Abstracts of Japan, Publication No. 04-325562, Nov. 13, 1992, (1 pg).
Patent Abstracts of Japan, Publication No. 04-161437, Jun. 4, 1992, (1 pg).
Patent Abstracts of Japan, Publication No. 04-161428, Jun. 4, 1992, (1 pg).
Patent Abstracts of Japan, Publication No. 04-320422, Nov. 11, 1992, (1 pg).
Patent Abstracts of Japan, Publication No. 04-335028, Nov. 24, 1992, (1 pg).
Patent Abstracts of Japan, Publication No. 05-070590, Mar. 23, 1993, (1 pg).
Patent Abstracts of Japan, Publication No. 2000-119521, Apr. 25, 2000, (1 pg).
Patent Abstracts of Japan, Publication No. 2000-080178, Mar. 21, 2000, (1 pg).
International Search Report, Dec. 20, 2005, (2 pgs).
Korean Office Action mailed Feb. 23, 2009 for Korean Patent Application No. 10-2007-7006992, including English translation (10 pgs).
Chinese Office Action mailed Apr. 3, 2009 for Chinese Patent Application No. 200580032118.1, including English translation (9 pgs).
Patent Abstracts of Japan, Publication No. 05-222219, Aug. 31, 1993, (1 pg).
Patent Abstracts of Japan, Publication No. 06-032926, Feb. 8, 1994, (1 pg).
Partial translation of Japanese Patent Publication No. 2000-080178, Mar. 21, 2000.
Partial translation of Japanese Patent Publication No. 2000-119521, Apr. 25, 2000.
Patent Abstracts of Japan, Publication No. 11-158276, Jun. 15, 1999, (1 pg).
English Language translation of International Preliminary Report on Patentability, issued Mar. 27, 2007, (6 pgs).

* cited by examiner

*Primary Examiner* — Gregory Listvoyb
(74) *Attorney, Agent, or Firm* — Kagan Binder, PLLC

(57) ABSTRACT

A process for the production of non-thermoplastic polyimide film whose precursor solution has high storage stability and which exhibits high adhesiveness even without expensive surface treatment, more specifically, a process for the production of non-thermoplastic polyimide film made of a non-thermoplastic polyimide containing a block resulting from a thermoplastic polyimide which comprises (A) the step of forming a prepolymer having amino or an acid anhydride group at the end in an organic polar solvent (B) the step of synthesizing a polyimide precursor solution by using the obtained prepolymer, an acid anhydride, and a diamine in such a way as to become substantially equimolar over the whole step, and (C) the step of casting a film-forming dope containing the polyimide precursor solution and subjecting the resultant dope to chemical and/or thermal imidization, wherein the diamine and acid dianhydride used in the step (A) are selected so that the reaction of both with each other in equimolar amounts can give a thermoplastic polyimide, and the polyimide precursor obtained in the step (B) is a precursor of a non-thermoplastic polyimide.

10 Claims, No Drawings

PROCESS FOR PRODUCTION OF POLYIMIDE FILM HAVING HIGH ADHESIVENESS

TECHNICAL FIELD

The present invention relates to a non-thermoplastic polyimide film that has a high adherability (a property for allowing adhesion thereto) with respect to adhesives, especially with respect to polyimide-based adhesives.

BACKGROUND ART

Recently, electronic products have been improved to be lighter in weight, smaller in size, and higher in density, thereby resulting in an increase in the demand for various types of substrates for printed wringing boards, especially, the demand for flexible laminate (which may be referred to as flexible printed wiring boards (hereinafter FPCs) or the like later). The flexible laminate has such a structure that a circuit is formed with a metal foil on an insulating film.

A flexible laminate is generally produced by adhering a metal foil on a substrate by heat and pressure applications with an adhesive material of various kinds therebetween. The substrate is an insulating film being flexible and made of an insulating material of various kinds. The insulating film is preferably a polyimide film or the like. The adhesive material is generally a heat-curable adhesive agent, which is epoxy-based, acryl-based, or the like. (The FPC in which such a heat-curable adhesive agent is used may be refereed to as a three-layered FPC).

The heat-curable adhesive agent is advantageous in that it allows adhesion at a relatively low temperature. However, it is expected that the three-layered FPCs cannot sufficiently satisfy future demands for better heat resistance, flexibility, and electric reliability. In view of this, FPCs in which a metal layer is formed directly on the insulating film, or in which the adhesive layer is made of a thermoplastic polyimide have been proposed (hereinafter, these FPCs may be referred to as two-layered FPCs). The two-layered FPCs show better characteristics than the three-layered, and higher demands for the two-layered FPCs are expected.

Polyimide films are generally poor in adherability with polyimide-based adhesives made of thermoplastic polyimide, and requires surface-roughing treatment (such as plasma treatment, corona treatment, or the like), treatment such as adding a coupling agent, a particular metal composition, or the like in order to attain high adherability. This leads to high cost, or deterioration in film property (see Patent Citations 1 to 3).

(Patent Citation 1) Japanese Patent Application Publication, Tokukaihei, No. 5-222219.
(Patent Citation 2) Japanese Patent Application Publication, Tokukaihei, No. 6-32926.
(Patent Citation 3) Japanese Patent Application Publication, Tokukaihei, No. 11-158276.

DISCLOSURE OF INVENTION

Technical Problem

In view of the aforementioned problem, an object of the present invention is to provide a method for producing a polyimide film that is adherable with respect to adhesive agents, especially polyimide-based adhesives.

Technical Solution

As a result of diligent studies to attain the object, the inventors of the present invention found that it is possible to attain a polyimide film by appropriate molecular designing and polymerization of a polyimide, the polyimide film having a high adherability with respect to adhesive agents, especially polyimide-based adhesive agents. The present invention is based on this finding.

Specifically, the present invention attain the object by the following methods.

1) A method for producing a polyimide film containing a non-thermoplastic polyimide having a block component derived from a thermoplastic polyimide, the method at least comprising:

(A) forming in an organic polar solvent a prepolymer from a diamine component (a) and an acid dianhydride component (b) in a molar amount that is less than that of the diamine component (a), the prepolymer having an amino group at one or each end;

(B) synthesizing a polyimide precursor solution from the prepolymer obtained in step (A), an acid dianhydride component (c), and a diamine component (d) in such amounts that make up equimolar amounts of acid dianhydride component and diamine component in the overall process;

(C) flow-casting a film formation dope solution containing the polyimide precursor solution and subjecting the film formation dope solution to chemical and/or thermal imidization, wherein the diamine component (a) and the acid dianhydride component (b) used in step (A) are so selected that a polyimide prepared from equimolar reaction of the diamine component (a) and the acid dianhydride component (b) is the thermoplastic polyimide, and wherein the polyimide precursor obtained in step (B) is a precursor of the non-thermoplastic polyimide.

2) A method for producing a polyimide film containing a non-thermoplastic polyimide having a block component derived from a thermoplastic polyimide, the method at least comprising:

(A) forming in an organic polar solvent a prepolymer from a diamine component (a) and an acid dianhydride component (b) in a molar amount that is more than that of the diamine component (a), the prepolymer having an acid anhydride group at one or each end;

(B) synthesizing a non-thermoplastic polyimide precursor solution from the prepolymer obtained in step (A), an acid dianhydride component (c), and a diamine component (d) in such amounts that make up equimolar amounts of acid dianhydride component and diamine component in the overall process;

(C) flow-casting a film formation dope solution containing the non-thermoplastic polyimide precursor solution and subjecting the film formation dope solution to chemical and/or thermal imidization, wherein the diamine component (a) and the acid dianhydride component (b) used in step (A) are so selected that a polyimide prepared from equimolar reaction of the diamine component (a) and the acid dianhydride component (b) is the thermoplastic polyimide, and wherein the polyimide precursor obtained in step (B) is a precursor of the non-thermoplastic polyimide.

3) The method as set forth in 1), wherein the block component derived from the thermoplastic polyimide is contained in a range of 20 to 60 mol % with respect to the whole non-thermoplastic polyimide.

4) The method as set forth in 1) or 2), wherein the diamine component (a) includes 2,2-bis (4-aminophenoxyphenyl) propane.

5) The method as set forth in 1) to 3), wherein a repeating number n of the thermoplastic polyimide block is in a range of 3 to 99.

6) The method as set forth in 1) to 4), wherein a repeating number n of the thermoplastic polyimide block is in a range of 4 to 90.

EFFECT OF THE INVENTION

A polyimide film obtained according to the present invention provides a better adherability, for example, between a metal foil and the polyimide film in producing a flexible metal-clad laminate. More specifically, the present invention, which attains a high adherability, can make it possible to form fine wiring pattern as required by the high-density packaging. Moreover, the polyimide film according to the present invention has a better adherability with respect to a thermoplastic polyimide used as an adhesive, compared with conventional polyimide films that are poor in the adherability with respect to thermoplastic polyimide as an adhesive. Therefore, the present invention can cope with the higher reflow temperature required by lead-free soldering.

BEST MODE FOR CARRYING OUT THE INVENTION

One embodiment of the present invention is described below. The present invention is a method for producing a polyimide film containing a non-thermoplastic polyimide having a block component derived from a thermoplastic polyimide. More specifically, the present invention includes:

(A) forming in an organic polar solvent a prepolymer from a diamine component (a) and an acid dianhydride component (b) in a molar amount that is less than that of the diamine component (a), the prepolymer having an amino group at one or each end;

(B) synthesizing a polyimide precursor solution from the prepolymer obtained in step (A), an acid dianhydride component (c), and a diamine component (d) in such amounts that make up equimolar amounts of acid dianhydride component and diamine component in the overall process;

(C) flow-casting a film formation dope solution containing the polyimide precursor solution and subjecting the film formation dope solution to chemical and/or thermal imidization.

Any known method may be applied to the method of the present invention, provided that the three steps are included in the method of the present invention.

As an alternative, the present invention may be arranged such that the method includes:

(A) forming in an organic polar solvent a prepolymer from a diamine component (a) and an acid dianhydride component (b) in a molar amount that is more than that of the diamine component (a), the prepolymer having an acid anhydride group at one or each end;

(B) synthesizing a non-thermoplastic polyimide precursor solution from the prepolymer obtained in step (A), an acid dianhydride component (c), and a diamine component (d) in such amounts that make up equimolar amounts of acid dianhydride component and diamine component in the overall process;

(C) flow-casting a film formation dope solution containing the non-thermoplastic polyimide precursor solution and subjecting the film formation dope solution to chemical and/or thermal imidization.

Step (A)

Step (A) is for (i) forming in an organic polar solvent a prepolymer from a diamine component (a) and an acid dianhydride component (b) in a molar amount that is less than that of the diamine component (a), the prepolymer having an amino group at one or each end, or (ii) forming in an organic polar solvent a prepolymer from a diamine component (a) and an acid dianhydride component (b) in a molar amount that is more than that of the diamine component (a), the prepolymer having an acid anhydride group at one or each end. In step (A), it is important to select the diamine component (a) and the acid dianhydride component (b) such that the polyimide that will be produced by reacting the diamine component (a) and S the acid dianhydride component (b) in equimolar amounts will be a thermoplastic polyimide. This arrangement makes it possible to introduce in the finally-obtained non-thermoplastic polyimide a block component derived from the thermoplastic polyimide. The polyimide film containing the non-thermoplastic polyimide in which the block component derived from the thermoplastic polyimide is introduced, is high in adherability for a metal foil. Therefore, a flexible metal-clad laminate can be produced by adhering the polyimide film and a metal foil together with excellent adhesiveness.

In the present invention, the block component derived from the thermoplastic polyimide is such a component whose polymer composes a film that melts and does not retain its original shape when heated to a temperature of 450° C. for one min. More specifically, the selection of the diamine component (a) and acid dianhydride component (b) is carried out by checking whether or not a polyimide obtained by reacting the diamine component (a) and acid dianhydride component (b) in equimolar amounts will melt or lose its film shape at the temperature. The prepolymer having an amino group at one or each end may be prepared by reacting in the organic polar solvent the thus selected component (a) and the thus selected component (b) in such amounts that the component (b) is in a molar amount that is less than that of the component (a). As an alternative, the prepolymer having an acid anhydride group at one or each end (at least one kind of acid anhydride group at one or each end) may be prepared by reacting in the organic polar solvent the thus selected component (a) and the thus selected component (b) in such amounts that the component (b) is in a molar amount that is more than that of the component (a). The prepolymer is the thermoplastic polyimide block component.

The temperature at which the polyimide will melt is preferably in a range of 250 to 450° C., especially in a range of 300 to 400° C. If the temperature was too low, it would possibly become difficult to obtain the non-thermoplastic polyimide film finally. If the temperature was too high, it would possibly become difficult to obtain the high adherability that the present invention is to attain.

Moreover, the thermoplastic polyimide block component is contained in the polyimide in a range of 20 to 60 mol %, preferably in a range of 25 to 55 mol %, and especially preferably in a range of 30 to 50 mol % with respect to the whole polyimide.

If the polyimide contained the thermoplastic polyimide block component in a ratio less than the ranges, it would possibly become difficult to attain the excellent adherability of the present invention. If the polyimide contained the thermoplastic polyimide block component in a ratio less than the ranges, it would possibly become difficult to attain the non-thermoplastic polyimide film finally. In the present invention, the content of the thermoplastic polyimide block component is calculated out by the following Equation (1) in case where the diamine component is excess with respect to the acid component in the synthesis. Meanwhile, the content of the thermoplastic polyimide block component is calculated out by the following Equation (2) in case where the acid component is excess with respect to the diamine component in the synthesis.

(Thermoplastic Block Component Content)=$a/P \times 100$     (1)

a: the content of the component (a) (mol)
P: the whole content of the diamine (mol)

(Thermoplastic Block Component Content)=$b/Q \times 100$     (2)

b: the content of the component (b) (mol)
Q: the whole content of the acid component (mol)

Moreover, a repeating number n of the thermoplastic block component is preferably in a range of 3 to 99, and more preferably in a range of 4 to 90. If the repeating number n is less than the ranges, it would be difficult to attain an excellent adherability, and result in a large moisture expansion coefficient. Moreover, if the repeating number n was greater than the ranges, the polyimide precursor solution would be poor in the storage stability, and reproducibility of the polymerization would be poor as well. Thus, it is not preferable that the repeating number n be greater than the ranges. It is possible to control the repeating number (n) by adjusting the ratios between the components (a) and (b) ((a)/(b)) in the initial addition. There is a possibility that the repeating number (n) would be influenced from stirring efficiency. In the present invention, however, the influence from the stirring efficiency is ignored and the repeating number (n) is a number theoretically worked out from the molar ratio (a)/(b).

It is preferable to select and employ the diamine component (a) and the acid dianhydride (b) for the thermoplastic polyimide block component in the present invention such that the polyimide obtained by reacting the diamine component (a) and the acid dianhydride component (b) in equimolar amounts will have glass transition temperature (Tg) in a range of 150 to 300° C. Moreover, Tg can be worked out from a point of inflection of the storage elasticity modulus measured by using a dynamic mechanical analyzer (DMA).

The monomers for constituting the thermoplastic polyimide block component in the present invention is explained below. Preferable examples of a main constituent of the diamine component encompass 4,4'-diaminodiphenylpropane, 4,4'-diaminodiphenylmethane, 4,4'-diaminodiphenylsulfide, 3,3'-diaminodiphenylsulfone, 4,4'-diaminodiphenylsulfone, 4,4'-oxydianiline, is 3,3'-oxydianiline, 3,4'-oxydianiline, 4,4'-diaminodiphenyldiethylsilane, 4,4'-diaminodiphenylsilane, 4,4'-diaminodiphenylethylphosphineoxide, 4,4'-diaminodiphenyl N-methylamine, 4,4'-diaminodiphenyl N-phenylamine, 1,4-diaminobenzene(p-phenylenediamine), bis{4-(4-aminophenoxy)phenyl}sulfone, bis{4-(3-aminophenoxy)phenyl}sulfone, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 3,3'-diaminobenzophenone, 4,4'-diaminobenzophenone, 2,2-bis(4-aminophenoxyphenyl)propane, etc. They may be employed solely or in combination. The examples mentioned above are examples of compounds suitable as the main constituent. Any diamine may be adopted as a sub constituent. Above all, some diamines are especially preferable. Examples of such diamines encompass: 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 1,3-bis(4-aminophenoxy)benzene, 1,3-bis(3-aminophenoxy)benzene, 2,2-bis(4-aminophenoxyphenyl) propane. The use of any of these makes it easier to obtain the thermoplastic polyimide block component. Moreover, what is meant by the term "main constituent" is a constituent that constitutes 10 mol % or more of the whole.

Examples of suitable acid components that constitute the thermoplastic polyimide precursor block component encompass pyromellitic dianhydride, 3,3',4,4'-benzophenonetetracarboxylic dianhydride, 3,3',4,4'-biphenyltetracarboxylic dianhydride, 4,4'-oxydiphthalic dianhydride, and the like. These acid components may be used solely or in combination. In the present invention, it is preferable that at least one acid dianhydride selected from the group constituted of 3,3',4,4'-benzophenonetetracarboxylic dianhydride, 3,3',4,4'-biphenyltetracarboxylic acid anhydride, and 4,4'-oxydiphthalic dianhydride be used as the acid dianhydride. The use of the acid dianhydrides makes it easier to attain the effect of the present invention, that is, high adherability with respect to adhesives.

Step (B)

Step (B) synthesizes the polyimide precursor solution from the prepolymer obtained in Step (A), an acid dianhydride component (c), and a diamine component (d). The acid dianhydride component (c) and the diamine component (d) are selected such that the polyimide produced from the polyimide precursor solution obtained in Step (B) will be a non-thermoplastic polyimide. Checking whether or not the polyimide is a non-thermoplastic polyimide can be performed by checking outer appearance of a film after heating the film at 450° C. for 1 min with the film held in a metal frame. If the film was not melt or shrunk, or maintained its outer appearance, the polyimide film would be judged as being non-thermoplastic. In Step (B), the prepolymer obtained in Step (A), the acid dianhydride component (c), and the diamine component (d) are substantially in equimolar amounts. The polyimide precursor may be obtained via multi-staged process.

The polyamic acid solution thus obtained is obtained in concentration of generally 5 to 35 wt. %, preferably 10 to 30 wt. %. The polyamic acid solution has appropriate molecular weight and solution viscosity with concentration within these ranges.

The followings are examples of diamines and acid dianhydrides preferable in the present invention to be reacted with the thermoplastic polyimide precursor block component SO as to produce the non-thermoplastic polyimide precursor. It is impossible to specify which diamine and acid dianhydride are preferable generally, because different combinations of diamine and acid dianhydride give different properties. It is, however, preferable that a main constituent of the diamine be a rigid constituent such as paraphenylenediamine and its derivatives, and benzidine and its derivatives. The use of diamine having a rigid structure gives the non-thermoplastic property and makes it possible to attain a high elasticity. Moreover, the examples of the acid component encompass pyromellitic dianhydride, 2,3,7,8-naphthalenetetracarboxylic dianhydride, etc. It is preferable that a main constituent of the acid component be pyromellitic dianhydride. It is well known that pyromellitic dianhydride has a rigid structure. The rigid structure of pyromellitic dianhydride makes it easier to attain the non-thermoplastic polyimide.

In the present invention, the following polymerization method is preferable for easy controlling of the polymerization and for convenience due to apparatus reason. In the preferably polymerization method, the thermoplastic polyimide precursor block component is synthesized and then the diamine component (d) and acid dianhydride component (c) are added thereto in the appropriately-designed molar ratio, so as to prepare the non-thermoplastic polyimide precursor.

Any solvents that can dissolve the polyimide precursor (hereinafter, referred to as polyamic acid) can be preferably used as the solvent for the synthesis of the polyamic acid. Examples of the preferable solvents encompass amide-type solvents such as N,N-dimethylformamide, N,N-dimethylacetoamide, and N-methyl-2-pyrrolidone. N,N-dimethylformamide, and N,N-dimethylacetoamide are especially preferable.

The polyamic acid solution thus prepared is excellent in the storage stability. Therefore, the production method of the present invention allows stable industrial production of the polyimide film.

Step C

Step C is for flow-casting a film formation dope solution containing the polyimide precursor solution (polyamic acid) and subjecting the film formation dope solution to chemical and/or thermal imidization, thereby finally producing the non-thermoplastic polyimide film. The film formation dope solution may include a filler in order to improve various properties of the films such as slidability, heat conductivity, electric conductivity, corona resistance, loop stiffness, etc. The filler to be used in the present invention is not particularly limited. Preferable examples of the inorganic filler encompasses silica, titanium oxide, alumina, silica nitride, boron nitride, dibasic calcium phosphate, calcium phosphate, and mica, etc.

The present invention is not particularly limited in terms of particle diameter of the filler, because the particle diameter of the filler is determined according to which film property is to be improved, and which kind of filler is to be added, etc. In general, the average particle diameter is in a range of 0.05 to 100 μm. It is preferable that the average particle diameter be in a range of 0.1 to 75 μm. It is more preferable that the average particle diameter be in a range of 0.1 to 50 μm. It is further preferable that the average particle diameter be in a range of 0.1 to 25 μm. With particle diameters of the filler less than the range, it becomes difficult to attain property improvements. Particle diameters of the filler greater than the range would cause significant deterioration in surface properties or in mechanical properties. The present invention is not particularly limited in terms of an amount of the filler to be added, either, because the particle diameter of the filler is determined according to which film property is to be improved, and how large the particle diameter of the filler is, etc. In general, it is acceptable that the amount of the filler to be added be in a range of 0.01 to 100 parts by weight with respect to 100 parts by weight of polyimide. It is preferable that the amount of the filler to be added be in a range of 0.01 to 90 parts by weight with respect to 100 parts by weight of polyimide. It is more preferable that the amount of the filler to be added be in a range of 0.02 to 80 parts by weight with respect to 100 parts by weight of polyimide. When the filler is added in an amount less than the range, it is difficult to attain the property improvements by the addition of the filler. Meanwhile, if the filler was added in an amount greater than the range, the filler would significantly deteriorate the mechanical property of the film.

The filler may be added by any method. The examples of the method include:

1. Method of adding the filler to the polymerization solution before or during the polymerization;

2. Method of adding and kneading the filler into the polymerization solution with a three-shaft roller after completion of the polymerization; and 3. Method including preparing a dispersion containing the filler in advance and adding the dispersion into a polyamic acid organic solvent solution.

Any method may be employed for the addition of the filler. However, the method including preparing a dispersion containing the filler in advance and adding the dispersion into a polyamic acid organic solvent solution, especially right before the film formation is preferable because contamination of the production line with the filler in this method is least severe. In the preparation of the dispersion, it is preferable to use the same solvent as the polymerization solvent of the polyamic acid. In order to sufficiently disperse the filler and stabilize the dispersion state, a dispersant, a thickener, or the like may be used in amounts that do not adversely affect the properties of the film.

For the sake of the adherability, the polyimide film of the present invention preferably contain, by 50 wt. % or more, the thermoplastic polyimide having the block component derived from the thermoplastic polyimide.

Conventionally known methods may be employed to produce the polyimide film from the film formation dope containing the polyamic acid. Examples of the conventionally known method encompass thermal imidization method and chemical imidization method. Any method may be employed to produce the film. However, by carrying out the imidization by adopting the chemical imidization method, it is easier to obtain is the polyimide film having various properties suitable for the present invention.

Moreover, an especially-preferable method according to the present invention for producing the polyimide film include:

(1) flow-casting, on a support, a film formation dope containing the polyamic acid solution;

(2) heating the film formation dope on the support and then removing a gel film from the support; and (3) further heating the gel film so as to imidize remaining amic acid and dry the gel film.

In the above process, a curing agent containing a dehydrating agent or an imidization catalyst may be used. Typical examples of the dehydrating agent include acid anhydrides such as acetic anhydride. Typical examples of the imidization catalyst include tertiary amines such as isoquinoline, β-picoline, pyridine, etc.

In the following, a preferable embodiment is described to explain the production process of the polyimide film. In the embodiment, the chemical imidization is explained for example. It should be noted that the present invention is not limited to the following example, and the film formation condition and heating condition may be varied as appropriate according to the kinds of the polyamic acid, film thickness, etc.

The dehydrating agent and imidization catalyst are added into the polyamic acid solution thereby preparing a film formation dope. Then, the film formation dope is cast on a support such as a glass board, an aluminum foil, endless stainless belt, stainless drum, or the like, thereby forming a film thereof on the support. The film on the support is heated in a temperature in a range of 80° C. to 200° C., preferably in a range of 100° C. to 180° C. in order to activate the dehydrating agent and the imidization catalyst. Thereby, the film is partially cured and/or dried. Then, the film is removed from the support thereby obtaining a polyamic acid film (hereinafter this film is referred to as a "gel film").

The gel film is in an intermediate state in the curing of the polyamic acid to the polyimide. The gel film is a self-supportive film. A volatile content of the gel film is expressed as formula (3):

$$(A-B) \times 100 / B \tag{3}$$

where A is a weight of the gel film, and B is a weight of the gel film after heated at 450° C. for 20 min.

The volatile content of the gel film is in a range of 5 to 500 wt. %, preferably in a range of 5 to 200 wt. %, and more preferably in a range of 5 to 150 wt. %. It is preferable to use a film in these ranges. In a curing process, there is a risk of film breakage, lack of uniformity in color tone of the film due to unevenly drying the film, and property instability, etc. The amount of the dehydrating agent is in a range of 0.5 to 5 mol, and preferably in a range of 1.0 to 4 mol per unit of amic acid in the polyamic acid. Moreover, the amount of the imidization catalyst is in a range of 0.05 to 3 mol, and preferably in a range of 0.2 to 2 mol per unit of amic acid in the polyamic acid. The chemical imidization would be insufficient when the amounts of the dehydrating agent and imidization catalyst are below the ranges. The insufficient chemical imidization would result in the film breakage during the curing or low mechanical strength. On the other hand, the imidization would proceed undesirably too fast when the amounts of the dehydrating agent and imidization catalyst are above the ranges. The too-fast imidization would make it difficult to cast the solution into the film-like shape.

The gel film held at its ends is dried. By being held at its ends, the gel film can avoid the shrinkage due to the curing. The drying removes water, residual solvent, residual converting agent, and catalyst from the film, and completes the imidization of the residual amic acid. Thereby, the polyimide film of the present invention can be obtained. The drying is preferably carried out at a temperature in a range of 400 to 650° C. for a time period in a range of 5 to 400 sec. Drying carried out at a temperature higher than the range and/or for a time period longer than the range would possibly cause thermal deterioration in the film. On the other hand, drying carried out at a temperature lower than the range and/or for a time period shorter than the range would possibly fail to attain the desired effect.

Moreover, the film may be extended before or after the fixing the gel film. For this extending, the film has a volatile content in a range of 100 to 500 wt. %, and preferably in a range of 150 to 500 wt. %. Volatile content below the range would make it difficult to extend the film. Volatile content above the range causes the film to be poor in self-supporting property, which makes it difficult to perform the extending operation.

The extending operation may be carried out by using any known method, encompassing a method using differential rollers are used, a method widening a gap of a tenter, etc.

Moreover, the film may be heated treated under lowest tension necessary for conveying a film for alleviating an internal stress remained in the film. The heat treatment may be carried out during the film production process, or may be carried out in addition to the process. The heating condition cannot be specified because the heating condition varies depending on film property or apparatus to use. The internal stress can be alleviated by heating at a temperature generally not less than 200° C. but not more than 500° C., preferably not less than 250° C. but not more than 500° C., especially preferably not less than 300° C. but not more than 450° C., for a time period in a range of 1 to 300 sec, preferably in a range of 2 to 250 sec, and especially preferably in a range of 5 to 200 sec.

The film obtained according to the production method of the present invention exhibits an excellent adherability for directly providing a metal layer thereon or for laminating a metal foil thereon via an adhesive of various kinds. Especially, the film obtained according to the production method of the present invention exhibits an excellent adherability even with respect to the imide-based adhesives, with which conventional polyimide films cannot be adhered with good adhesiveness. Moreover, the film obtained according to the production method of the present invention is excellent in the balance between the linear expansion coefficient and moisture expansion coefficient.

EXAMPLES

In the following, the present invention is explained in more details, referring to Examples. It should be noted that the present invention is not limited to these Examples. Thermoplastic polyimide in Synthesis Examples, Examples, and Comparative Examples were evaluated in grass transition temperature, dimensional change ratio in flexible laminate, metal foil peel strength in the following manner.

(Metal Foil Peel Strength: Adhesion Strength)

A sample was prepared according to "6.5 Peel Strength" of JIS C6471. Measured was a load necessary for peeling a metal foil portion of 5 mm width at the peeling angle of 180 degrees at a rate of 50 mm/min.

(Elasticity)

Elasticity was measured according to ASTM D882.

(Linear Expansion Coefficient)

The linear expansion coefficient when heated from 50° C. to 200° C. was conducted with a thermomechanical analyzer TMA120C produced by Seiko Instruments Inc. The linear expansion coefficient was measured as follows: A sample (3 mm in width and 10 mm in length) was heated from 10° C. to 400° C. at a rate of 10° C./min under a load of 3 g. Then, the sample was cooled to 10° C., and again heated at 10° C./min. The thermal expansion coefficients at 50° C. and 200° C. measured during the second heating were averaged to determine the linear expansion coefficient.

(Moisture Expansion Coefficient)

The length (L1) of a film was measured at 50° C. and 30% Rh. Subsequently, the humidity was increased to 80% Rh, and the length (L2) of the film at 50° C. and 80% Rh was measured. The moisture expansion coefficient was determined by the following equation:

$$\text{Thermal Expansion Coefficient (ppm)} = (L1-L2)/L1/(80-30) \times 10^6$$

(Dynamic Viscoelasticity Measurement)

A sample (9 mm in width and 40 mm in length) was measured with DMS200 produced by Seiko Instruments Inc., at frequencies of 1, 5, and 10 Hz and a heating rate of 3° C./min in the temperature range of 20° C. to 400° C. The temperature at the inflection point of a curve indicating the storage modulus plotted versus temperature was assumed as the glass transition temperature.

(Solution Storage Stability)

The storage stability of the polyimide precursor solution was determined by visually inspecting a produced solution that had been kept at 5° C. in a fridge for 1 month.

(Plasticity Evaluation)

The plasticity was evaluated by holding a prepared film of 20×20 cm with a frame made of SUS in a square shape (outer frame 20×20 cm, inner frame 18×18 cm), and then heating the film at 450° C. for 1 min. Films which maintained their shape without melting or shrinking after the heat treatment were judged as non-thermoplastic.

Reference Example 1

Synthesis of Thermoplastic Polyimide Precursor

Into a glass flask of 2000 ml in volume, 780 g of DMF, 115.6 g of 2,2-bis[4-(4-aminophenoxy)phenyl]propane (BAPP) were added. Then, 78.7 g of 3,3'4,4'-biphenyltetracarboxylic dianhydride (BPDA) was gradually added thereto under stirring in a nitrogen atmosphere. After that, 3.8 g of ethylenebis(trimellitic acid monoester anhydride) (TMEG) was added thereto. Then, a mixture thus prepared was stirred in an ice bath for 30 min, thereby obtaining a reaction solution. A solution in which 2.0 g of TMEG was dissolved in 20 g of DMF was separately prepared. While monitoring viscosity, the solution was added to the reaction solution gradually under stirring. When the viscosity reached 3000 poise, the addition and stirring were stopped. Thereby, a polyamic acid solution was obtained.

The polyamic acid solution was flow-cast on a 25 μm PET film (Cerapeel HP, produced by Toyo Metallizing Co., Ltd.) so that the final thickness would be 20 μm, and dried at 120° C. for 5 minutes. The resulting self-supporting film after the drying was peeled from the PET film, fixed onto a metal pin frame, and dried at 150° C. for 5 minutes, at 200° C. for 5 minutes, at 250° C. for 5 minutes, and at 350° C. for 5 minutes to give a single-layer sheet. The glass transition temperature of the thermoplastic polyimide was 240° C. This film held by the metal frame was heated at 450° C. As a result, the film did not maintain its shape. Thus, the film was judged as being thermoplastic.

(Adherability Evaluation)

A polyimide film was pretreated by surface treatment of corona density of 200 W·min/m$^2$. The polyamic acid solution obtained in Reference Example 1 was diluted with DMF to solid content of 10 wt. %. The diluted polyamic acid was applied on each side of the surface-treated polyimide film such that a thermoplastic polyimide layer (adhesive layer) on each side would be 4 μm in thickness finally. Then, this polyimide film was heated at 140° C. for 1 min. After that, the polyimide film was passed through a far-infrared heater furnace of atmospheric temperature of 390° C. for 20 sec for thermal imidization. Thereby a heat-resistant adhesive film was obtained. On each side of the thus prepared adhesive film, a 18 μm rolled copper foil (BHY-22B-T, Japan Energy Corp.) and a protective material (Apical 125 NPI, Kaneka Corp.) on top of each copper foil were thermally laminated at lamination temperature of 360° C. and lamination pressure of 196N/cm (20 kgf/cm) at lamination speed 1.5 m/min. By such thermal lamination, an FCCL was obtained. Adhesive strength of the FCCL was measured. Moreover, an FCCL not-treated with the corona treatment was prepared in the same manner except that no corona treatment was carried out. Adhesive strength of the FCCL was also measured.

Example 1

(1) Into 546 g of N,N-dimethylformamide (DMF) cooled to 10° C., 46.43 g of 2,2-bis(4-aminophenoxyphenyl)propane (BAPP) was dissolved. Then, 9.12 g of 3,3',4,4'-benzophenonetetracarboxylic dianhydride (BTDA) was added and dissolved into the solution of BAPP in DMF. After 16.06 g of pyromellitic dianhydride (PMDA) was added therein, the solution was stirred for 30 min. Thereby, a thermoplastic polyimide precursor block component was formed.

(2) After 18.37 g of p-phenylenediamine (p-PDA) was dissolved therein, 37.67 g of PMDA was added in the solution, followed by one hour stirring to dissolve it in the solution. A separately-prepared solution in which PMDA was dissolved in DMF (PMDA 1.85 g/DMF 24.6 g) was carefully added into the thus prepared solution until viscosity of the solution reached 3000 poise. Then, the solution was stirred for one hour. Thereby, a polyamic acid solution was obtained, whose solid content was approximately 19 wt %, and rotational viscosity was 3400 poise at 23° C.

Into 10 g of the polyamic acid solution, 50 g of a curing agent composed of acetic anhydride/isoquinoline/DMF (in a ratio of 18.90/7.17/18.93 by weight) was added. Then, the polyamic acid solution was stirred and degassed at a temperature of 0° C. or less, and flow-cast on an aluminum foil by using a comma coater. The resin film was heated at 130° C. for 100 sec. A self-supportive gel film thus prepared was peeled off from the aluminum foil (volatile content 45 wt. %). Then, the gel film was held in a metal frame. After that, the gel film was heated at 300° C. for 20 sec. 450° C. for 20 sec, and 500° C. of 20 sec for drying and imidization. Thereby a polyimide film of 25 μm in thickness was obtained. Obtained film properties and adhesion properties are shown in Table 1. A film could not be prepared from a polyamic acid solution prepared with a ratio of BAPP/BTDA/PMDA=46.43 g/9.12 g/18.53 g, because the polyamic acid solution melted to lose its shape at the heating at 450° C. This confirmed that the prepolymer obtained in (1) was a thermoplastic block component.

Examples 2 and 3, Comparative Examples 1 and 2

Polyimide films were prepared in the same manner as in Example 1, but with different monomer ratios. Obtained film properties and adhesive properties are shown in Table 1.

Moreover, a block component was prepared from PDA and PMDA in Comparative Example 1. A film could not be prepared from a polyamic acid solution, because it was too fragile to become a film. This confirmed that the block component is not a thermoplastic block component of the present invention. Moreover, no block component was prepared in Comparative Example 2.

TABLE 1

|  |  | Ex. 1 |  | Ex. 2 |  | Ex. 3 |  | Com. Ex. 1 |  | Com. Ex. 2 |  |
|---|---|---|---|---|---|---|---|---|---|---|---|
| PC | BC | BAPP | 40 | BAPP | 50 | BAPP | 40 | PDA | 60 | PDA | 60 |
|  |  | BTDA | 10 | BTDA | 40 | BTDA | 10 | PMDA | 54 | BAPP | 40 |
|  |  | PMDA | 26 |  |  | PMDA | 22 | BAPP | 40 | BTDA | 10 |
|  |  | PDA | 60 | PDA | 50 | PDA | 60 | BTDA | 10 | PMDA | 90 |
|  |  | PMDA | 64 | PMDA | 60 | PMDA | 68 | PMDA | 36 |  |  |
| BCRN |  | 9 |  | 4 |  | 4 |  |  |  |  |  |
| TBCC (%) |  | 40 |  | 50 |  | 40 |  |  |  |  |  |
| SSS |  | Good |  | Good |  | Good |  | Bad (Colloidal Precip.) |  | Good |  |
| PE |  | Non |  | Non |  | Non |  | Non |  | Non |  |
| E (GPa) |  | 7.3 |  | 6.1 |  | 6.5 |  | 7.1 |  | 6.2 |  |
| LEC (ppm) |  | 11 |  | 22 |  | 16 |  | 10 |  | 15 |  |

TABLE 1-continued

|  | Ex. 1 | Ex. 2 | Ex. 3 | Com. Ex. 1 | Com. Ex. 2 |
|---|---|---|---|---|---|
| MEC (ppm) | 9 | 11 | 10 | 9 | 14 |
| AS  Y | 10.1 | 15.5 | 9.5 | 5.3 | 5.3 |
|     N | 6.5 | 12.3 | 5.7 | 2.2 | 3.1 |

Abbreviation:
"Ex." stands for Example.
"Com. Ex." stands for Comparative Example.
"PC" stands for Polymerization Components.
"BC" stands for Block Component.
"BCRN" stands for Block Component Repeating Number.
"TBCC" stands for Thermoplastic Block Component Content (%).
"SSS" stands for Solution Storage Stability.
"PE" stands for Plasticity Evaluation.
"E" stands for Elasticity (GPa).
"LEC" stands for Linear Expansion Coefficient (ppm).
"MEC" stands for Moisture Expansion Coefficient (ppm).
"AS" stands for Adhesion Strength (N/cm).
"Non" indicates that the polyimide was non-thermoplastic;
"precip." stands for precipitation.
"Y" stands for Yes (Corona Treatment was carried out).
"N" stands for No (Corona Treatment was not carried out).

INDUSTRIAL APPLICABILITY

Effect of the Invention

A polyimide film obtained according to the present invention provides a better adherability, for example, between a metal foil and the polyimide film in producing a flexible metal-clad laminate. More specifically, the present invention, which attains a high adherability, can make it possible to form fine wiring pattern as required by the high-density packaging. Moreover, the polyimide film according to the present invention has a better adherability with respect to a thermoplastic polyimide used as an adhesive, compared with conventional polyimide films that are poor in the adherability with respect to thermoplastic polyimide as an adhesive. Therefore, the present invention can cope with the higher reflow temperature required by lead-free soldering.

The invention claimed is:

1. A method for producing a polyimide film containing a non-thermoplastic polyimide having a block component derived from a thermoplastic polyimide by a process at least comprising the steps of
   (A) forming in an organic polar solvent a prepolymer from a diamine component (a) and an acid dianhydride component (b) in a molar amount that is less than that of the diamine component (a), the prepolymer having an amino group at one or each end;
   (B) synthesizing a polyimide precursor solution from the prepolymer obtained in step (A), an acid dianhydride component (c), and a diamine component (d) in such amounts that make up equimolar amounts of acid dianhydride component and diamine component in the overall process;
   (C) flow-casting a film formation dope solution containing the polyimide precursor solution and subjecting the film formation dope solution to chemical and/or thermal imidization,
   wherein the diamine component (a) and the acid dianhydride component (b) used in step (A) are so selected that a polyimide prepared from equimolar reaction of the diamine component (a) and the acid dianhydride component (b) is thermoplastic, and
   wherein the polyimide precursor obtained in step (B) is a precursor of the non-thermoplastic polyimide.

2. A method for producing a polyimide film containing a non-thermoplastic polyimide having a block component derived from a thermoplastic polyimide by a process at least comprising the steps of:
   (A) forming in an organic polar solvent a prepolymer from a diamine component (a) and an acid dianhydride component (b) in a molar amount that is more than that of the diamine component (a), the prepolymer having an acid anhydride group at one or each end;
   (B) synthesizing a non-thermoplastic polyimide precursor solution from the prepolymer obtained in step (A), an acid dianhydride component (c), and a diamine component (d) in such amounts that make up equimolar amounts of acid dianhydride component and diamine component in the overall process;
   (C) flow-casting a film formation dope solution containing the non-thermoplastic polyimide precursor solution and subjecting the film formation dope solution to chemical and/or thermal imidization,
   wherein the diamine component (a) and the acid dianhydride component (b) used in step (A) are so selected that a polyimide prepared from equimolar reaction of the diamine component (a) and the acid dianhydride component (b) is thermoplastic, and
   wherein the polyimide precursor obtained in step (B) is a precursor of the non-thermoplastic polyimide.

3. The method as set forth in claim 1, wherein the block component derived from the thermoplastic polyimide is contained in a range of 20 to 60 mol % with respect to the whole non-thermoplastic polyimide.

4. The method as set forth in claim 1, wherein the diamine component (a) includes 2,2-bis (4-aminophenoxypheny)propane.

5. The method as set forth in claim 2, wherein the diamine component (a) includes 2,2-bis (4-aminophenoxyphenyl) propane.

6. The method as set forth in claim 1, wherein a repeating number n of the thermoplastic polyimide block is in a range of 3 to 99.

7. The method as set forth in claim 2, wherein a repeating number n of the thermoplastic polyimide block is in a range of 3 to 99.

8. The method as set forth in claim 1, wherein a repeating number n of the thermoplastic polyimide block is in a range of 4 to 90.

9. The method as set forth in claim 2, wherein a repeating number n of the thermoplastic polyimide block is in a range of 4 to 90.

10. The method as set forth in claim 2, wherein the block component derived from the thermoplastic polyimide is contained in a range of 20 to 60 mol % with respect to the whole non-thermoplastic polyimide.

* * * * *

UNITED STATES PATENT AND TRADEMARK OFFICE
CERTIFICATE OF CORRECTION

PATENT NO. : 8,513,373 B2  
APPLICATION NO. : 11/663674  
DATED : August 20, 2013  
INVENTOR(S) : Kaneshiro et al.

Page 1 of 1

It is certified that error appears in the above-identified patent and that said Letters Patent is hereby corrected as shown below:

In the Claims:

Column 13, Line 64  
Claim 1,

"component (h) used in step (A)" should be -- component (b) used in step (A) --

Signed and Sealed this  
Twenty-second Day of October, 2013

Teresa Stanek Rea  
*Deputy Director of the United States Patent and Trademark Office*

UNITED STATES PATENT AND TRADEMARK OFFICE
CERTIFICATE OF CORRECTION

PATENT NO. : 8,513,373 B2 Page 1 of 1
APPLICATION NO. : 11/663674
DATED : August 20, 2013
INVENTOR(S) : Kaneshiro et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 514 days.

Signed and Sealed this
Fifteenth Day of September, 2015

Michelle K. Lee
*Director of the United States Patent and Trademark Office*